United States Patent [19]

Naber

[11] Patent Number: 5,144,405
[45] Date of Patent: Sep. 1, 1992

[54] TEMPERATURE COMPENSATION APPARATUS FOR LOGIC GATES

[75] Inventor: John F. Naber, Hardy, Va.

[73] Assignee: ITT Corporation, New York, N.Y.

[21] Appl. No.: 744,311

[22] Filed: Aug. 13, 1991

[51] Int. Cl.⁵ .................. H01L 27/02; H01L 23/58; G06G 7/10; H03B 1/04
[52] U.S. Cl. ........................ 357/51; 357/92; 357/28; 307/491; 307/542; 307/278
[58] Field of Search ............ 357/51, 4, 22, 91, 34, 357/92, 23.1, 28; 307/491, 542, 278, 310

Primary Examiner—Mark V. Prenty
Attorney, Agent, or Firm—Arthur L. Plevy

[57] ABSTRACT

A temperature compensation circuit enables the reliable operation of semiconductor logic gates over wide temperature ranges. The temperature compensation circuit includes a thin film resistor in series with an implanted resistor, both located on the same semiconductor substrate and both having one terminal connected together. The other terminal of one of the resistors is coupled to a point of reference potential, while the other terminal of the other resistor is coupled to an operating potential. A voltage is provided at the junction between the two resistors, which voltage is coupled to the logic gates. The voltage serves as a pull-down source and tracks over the wide temperature range to enable the logic gate to reliably operate with an adequate noise margin over temperature ranges between $-55°$ C. to $+125°$ C.

20 Claims, 1 Drawing Sheet

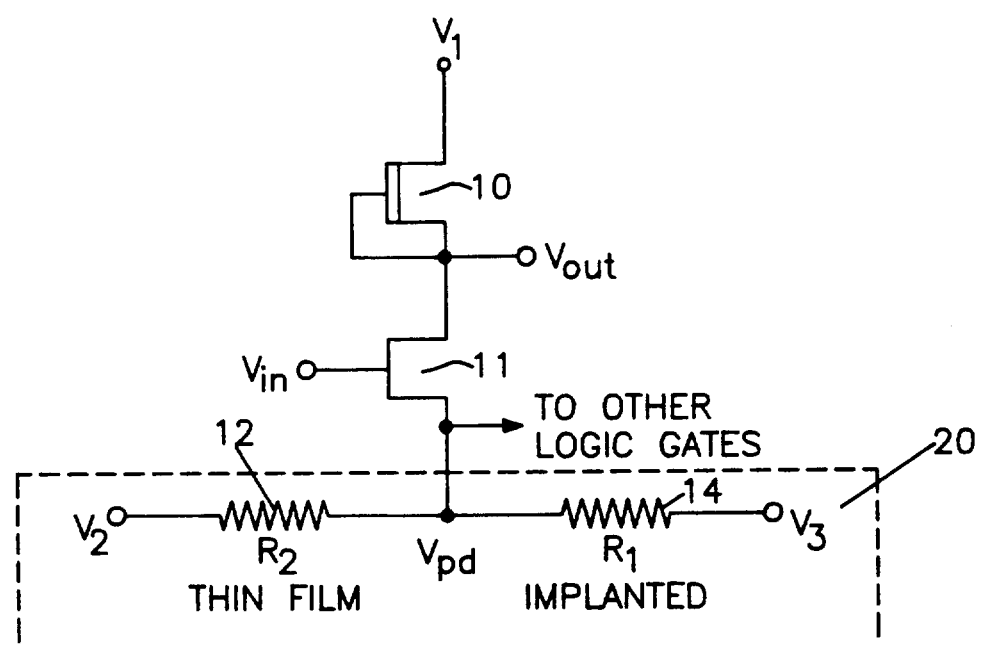

TEMPERATURE COMPENSATION APPARATUS FOR LOGIC GATES

FIELD OF THE INVENTION

This invention relates to apparatus for providing temperature compensation, and, more particularly, to apparatus for providing temperature compensation for semiconductor logic gate circuits.

BACKGROUND OF THE INVENTION

Temperature compensation in semiconductor circuits is well known. In both n and p type semiconductor devices as the temperature increases, a certain percentage of the more loosely held valence electrons produce free conduction electrons, and raising the temperature decreases the resistance of such semiconductor devices because of the increased number of free electron current carriers.

Diodes have been used in logic gate semiconductor circuits to track temperature variations. Band-gap circuits and FET summing circuits have been used to generate insensitive reference voltages over given temperature ranges. The use of diodes to track temperature variations require additional devices for each logic gate and hence, result in significant power increases. Furthermore, the tracking between the active devices, as transistors, FETs and so on, and the diodes is not sufficient to guarantee operation of a logic gate over a wide temperature range as, for example, the range required by military specifications. This temperature range is from $-55°$ C. to $+125°$ C. Diodes have been employed in temperature tracking circuits for many years. For example, a zener diode exhibits a breakdown voltage in a reverse bias state which increases as the diodes temperature increases. Similar measurements also show that the small voltage drop across a forward biased diode decreases as the temperature increases. These two opposing characteristics are combined and a temperature compensating unit can be formed to track temperature. Multiple diodes have also been employed to provide voltage references for logic gates and so on, which compensate temperature variations. Thus, the art of providing temperature compensation utilizing diodes is well-known. In any event, there is a serious problem with diode operation in regard to the temperature ranges discussed above. Diodes have also been employed together with transistors to provide circuits referred to as temperature compensated current sources. These operate in conjunction with differential amplifiers and other circuits but also exhibit the above-noted problems. One can employ thermistors and other temperature sensitive resistors, but these devices are non-linear devices and exhibit non-linear operation over wide temperature ranges. The band-gap and summing circuits as indicated above, generate a reference voltage during operation and do not improve the gate performance over wide temperature ranges.

A serious problem in employing modern technology in fabricating logic gates is that over the wide temperature range, there is an inadequate noise margin. Thus at elevated temperatures, the decreased noise margin limits the integration capability of gate arrays. In other words, for the high end of the temperature range in military applications, one cannot provide integrated circuit logic gates which will operate reliably. This is because of the fact that the gate performance decreases as the temperature increases and based on this factor, noise and other spurious signals will cause the gates to falsely operate, thereby creating circuits which are unreliable in the presence of noise.

It is therefore an object of the present invention to provide a temperature compensation circuit which will allow semiconductor logic gates to function reliably with adequate noise margin over a wide temperature range.

The circuit to be described further eliminates the need for any additional devices and eliminates the need for modification of the gate circuit itself.

The term "gate" includes logic integrated circuit gates which are fabricated on integrated circuit substrates and which include diode and transistor configurations as is well known. In logic systems, the three basic building blocks or logic gates include the inverter, the OR gate, and the AND gate. From these three components, most logic blocks can be formed, as for example, counters, registers and so on.

Thus, the compensation circuit to be described allows the use of logic gates which are fabricated utilizing integrated circuit techniques and formed from gallium arsenide (GaAs) and silicon LSI circuits. The gates provide adequate noise margins at the elevated temperatures and operate over the wide temperature range due to the temperature compensation apparatus according to this invention.

SUMMARY OF THE INVENTION

Temperature compensation apparatus employs two resistors in a series path. Each resistor has a different Temperature Coefficient of Resistance (TCR) to vary the pull-down supply of the logic gate. The resistors of different TCR's provide a compensated pull-down supply for the gate, to compensate for the temperature change and to allow the gate to function with adequate noise margin over a wide temperature range. The performance or noise margin of a semiconductor logic gate varies with temperature. At higher temperatures the noise margins will degrade to a point where the gate fails to operate properly. By varying the pull-down supply to compensate for the temperature changes, the gate is now enabled to continue to function with adequate noise margin.

BRIEF DESCRIPTION OF THE DRAWINGS

The sole drawing is a schematic diagram showing the temperature compensation circuit according to this invention.

DETAILED DESCRIPTION OF THE INVENTION

Referring to FIG. 1, there is shown, by way of example, a direct coupled (DC) field effect transistor (FET) logic inverter circuit (DCFL). The logic inverter includes a first field effect transistor or device 10 and a second field effect transistor 11. The field effect devices are MESFET field effect transistors as fabricated on a GaAs substrate. The compensated voltage source to be described can operate with other devices, as will be explained. The DCFL inverter is shown merely by way of example. It is desirable to operate the inverter and other gates which may be fabricated on a gallium arsenide (GaAs) substrate or by silicon technology on suitable silicon substrates over the temperature range of $-55°$ C. to $+125°$ C. A major problem in employing such gates is to operate the same with adequate noise margin over the wide temperature range. It is understood that while MESFETs are employed, other FET devices, such as MOSFETs and so on can be utilized as well. Furthermore, transistors, such as bipolar devices forming digital logic gates are well-known and can also be utilized in conjunction with the temperature compensated voltage supply to be described.

The field effect transistors 10 and 11, have the source to drain paths coupled in series between a voltage source $V_1$ and a compensated pull-down source designated as $V_{pd}$. The $V_{pd}$ source provides a temperature compensated voltage which is formed by means of a voltage divider consisting of a first resistor 12 in series with a second resistor 14. The voltage divider is directed between a first voltage source $V_2$ and a second voltage source $V_3$. A terminal of resistor 12 is connected to $V_2$, while the other terminal is connected to one terminal of resistor 14, whose other terminal is connected to $V_3$. The junction between resistors 12 and 14 provides the voltage $V_{pd}$. $V_{pd}$ as will be explained is a voltage which tracks over the wide temperature range, and hence, keeps the gate or inverter or any logic circuit connected thereto operating with noise immunities at elevated temperatures. As seen in the FIGURE, there is a dashed line drawn about the resistor configuration to indicate that both resistors are formed on a common substrate as is the logic gate. Resistor 12 is a thin film device which is deposited by an evaporation technique or otherwise formed on the GaAs or silicon substrate 20. Typical thin film resistor fabrication techniques are well known. On the other hand, the resistor 14 is an implanted device which essentially can be fabricated on a GaAs or silicon substrate using ion implantation. Such techniques are well-known and for example, utilize n-type ion transport gases or other materials to selectively implant highly doped ions on a GaAs or other substrate. In implementing thin film fabrication, one can employ Tungsten Nitride or other materials which can be evaporated on the surface of the GaAs or silicon substrate. It is the combination of the thin film and implanted resistor which gives a temperature coefficient for the logic gate enabling $V_{pd}$ to vary over the wide range of −55° C. to +125° C. in a direction to enable the gate to operate with a good noise margin.

It is of course understood that the above-described devices, as the implanted and thin film resistors are known in the art and are typically fabricated utilizing integrated circuit photolithographic techniques. It is also understood that different materials can be employed for the thin film and implanted resistors. Basically, thin film resistors exhibit controlled temperature coefficients and are relatively stable with temperature. There are many texts and articles which describe both implanted and thin film resistor devices. See, for example, a textbook entitled, "Linear Integrated Networks" by George S. Moschytz, Bell Telephone Laboratories, published by Van Nostrand Reinhold Company (1975). This text and other articles describe both the fabrication of implanted resistors, as well as thin film resistors on GaAs and silicon substrates.

The inverter shown employs FET 11, which has its gate electrode coupled to an input terminal $V_{IN}$ and with the drain to source path in series with the drain to source path of FET 10. FET 10 acts as a load resistor with the drain connected to the gate and with the output from the inverter taken from the connected electrodes and designated as $V_{OUT}$. In order for the inverter to operate properly the temperature compensating circuit has to track the FET 11 threshold variation over the temperature range of −55° C. to +125° C. The threshold variation, with respect to temperature, ($dV_t/dT$) is approximately −1mV/°C. therefore, at +125° C., the threshold voltage ($V_t$) will decrease 100 mV from its room temperature $V_t$ of 150 mV. However, in order to maintain proper gate operation ($V_{IN-LOW} - V_{pd}) = V_{gs}$ must be less than $V_t$ when the input is low or FET 11 will begin to conduct. $V_{gs}$ is the voltage from the gate (g) electrode of FET 11 to the source (s) electrode. When this occurs, the noise margin of the inverter gate decreases rapidly. In order to circumvent this problem, the voltage divider consisting of the implanted resistor 14 and the thin film resistor 12, is used as shown. Each resistor has a completely different Temperature Coefficient of Resistance (TCR) and selected so that $V_{pd}$ will track with $V_t$. Similar TCR resistors will track with respect to each other and such resistors will not work according to the operation of the circuit shown. In other words, as $V_t$ becomes more negative due to higher and higher temperatures, $V_{pd}$ will also become more negative to keep $V_t$ greater than $V_{gs}$. Power dissipation, and size will be considerably less because only two resistors are required per power supply. Alternate approaches required additional circuitry for each and every gate for the compensation. The junction between the resistors 12 and 14 designated as $V_{pd}$ is also directed to a plurality of other inverters or other logic gates, which as indicated above can be AND gates, OR gates and so on. Thus, power dissipation is extremely low and only two resistors are required per power supply. Test results from six different devices indicate that the average $V_t$ equals −0.97mV/°C. from −55° to +125° C. and the average variation of $V_{pd}$ equals − 1.23mV/°C. Hence, the net variation between $V_t$ and $V_{pd}$ will be (−1.23mV/°C.) minus (0.97mV/°C.) = −0.26mV/°C. However, without the temperature compensation circuit of resistors 12 and 14 the variation will be −0.97mV/°C. Therefore, the compensation circuit as described gives a 73% improvement in tracking $V_t$ with $V_{pd}$.

The analysis of the circuit is as follows. Assume that the terminal of resistor 14 designated by $V_3$ is coupled to a point of reference potential or ground, then the following equation defines the voltage, $V_{pd}$:

$$V_{pd} = \frac{V_2 \cdot R_1}{R_1 + R_2}$$

where
$R_1$ = implanted resistor 14
$R_2$ = thin film resistor 12.

The TCR of an implanted resistor is 100 times greater the TCR of a thin film resistor. Therefore, as the temperature increases, so will $V_{pd}$, since the value of resistor 12 will stay relatively constant as compared to resistor 14. It is important that resistor 12 be a thin film device while resistor 14 is an implanted device. As indicated above, thin film devices can be made extremely stable over wide temperature ranges. The field effect devices as most semi-conductor devices vary widely over a wide temperature range.

The above-noted voltage divider is an extremely simple circuit and can be used with a plurality of different devices.

It would be understood that other resistor configurations employing implanted and thin film devices can also be employed to provide temperature compensation. These, and various other embodiments, as can be discerned by those skilled in the art are deemed to be encompassed within the scope of the appended claims.

I claim:

1. A temperature compensation apparatus for supplying a compensated potential enabling semiconductor integrated circuit logic gates formed on an IC substrate to be biased to exhibit adequate noise margin operation over a wide temperature range, comprising:
   a voltage divider located on said substrate and formed by the series combination of a first thin film resistor and a second implanted resistor, with the common terminal between said resistors coupled to at least one logic gate on said substrate.

2. The apparatus according to claim 1, wherein the other terminal of said first resistor is coupled to a source of potential.

3. The apparatus according to claim 2, wherein the other terminal of said second resistor is coupled to a point of reference potential.

4. The apparatus according to claim 1, wherein the temperature coefficient of resistance (TCR) of said second resistor is about 100 times greater than the TCR of said first resistor.

5. The apparatus according to claim 1, wherein said substrate is fabricated from GaAs and said logic gates are MESFET gates.

6. The apparatus according to claim 5, wherein said first resistor is fabricated from tungsten nitride.

7. The apparatus according to claim 6, wherein said second resistor is an ion implanted resistor.

8. The apparatus according to claim 1, wherein said substrate is silicon.

9. The apparatus according to claim 8, wherein said logic gates are bipolar transistor gates.

10. The apparatus according to claim 8, wherein said logic gates are MOSFET gates.

11. The apparatus according to claim 5, wherein said MESFET gates are direct coupled logic gates.

12. The apparatus according to claim 1, wherein said wide temperature range is from $-55°$ C. to $+125°$ C.

13. Temperature compensation apparatus for supplying a compensated potential which tracks over a wide temperature range to enable semiconductor integrated circuit logic gates formed on a substrate to be biased with said potential to exhibit adequate noise margin operation over said range, comprising:
   a voltage divider formed on said substrate from a first resistor in series with a second resistor with said first resistor having a temperature coefficient of resistance (TCR) of about 100 times greater than said second resistor, to provide a compensated potential at the junction between said resistors when an operating potential is applied between said divider and with said junction coupled to at least one logic gate on said substrate.

14. The apparatus according to claim 3, wherein said first resistor is an implanted resistor with said second resistor being a thin film resistor.

15. The apparatus according to claim 14, wherein said first resistor is ion implanted.

16. The apparatus according to claim 15, wherein said second resistor is evaporated on said substrate.

17. The apparatus according to claim 14, wherein said substrate is GaAs.

18. The apparatus according to claim 17, wherein said logic gate is a MESFET gate.

19. The apparatus according to claim 14, wherein said second resistor is formed from tungsten nitride.

20. The apparatus according to claim 13, wherein said substrate is silicon and said logic gate is a bipolar transistor gate.

* * * * *